US007239170B2

(12) United States Patent
Suen et al.

(10) Patent No.: US 7,239,170 B2

(45) Date of Patent: Jul. 3, 2007

(54) APPARATUS AND METHODS FOR IMPROVED INPUT/OUTPUT CELLS

(75) Inventors: Victor Suen, Fremont, CA (US); William Lau, Foster City, CA (US); Hong-Him Lim, San Jose, CA (US); Cheng-Gang Kong, Saratoga, CA (US)

(73) Assignee: LSI Corporation, Milpitas, CA (US)

(*) Notice: Subject to any disclaimer, the term of this patent is extended or adjusted under 35 U.S.C. 154(b) by 687 days.

(21) Appl. No.: 10/614,956

(22) Filed: Jul. 8, 2003

(65) Prior Publication Data

US 2005/0010833 A1 Jan. 13, 2005

(51) Int. Cl.
*H03K 17/16* (2006.01)
*H03K 19/003* (2006.01)

(52) U.S. Cl. .......................................... 326/30; 326/86

(58) Field of Classification Search ............ 326/29–30, 326/82–83, 86; 327/108–109, 175, 333, 327/436

See application file for complete search history.

(56) References Cited

U.S. PATENT DOCUMENTS 3,617,845 A * 11/1971 McKenna ................... 388/828
6,118,310 A * 9/2000 Esch, Jr. ..................... 327/108
6,242,945 B1 * 6/2001 New ........................... 326/39
6,388,495 B1 * 5/2002 Roy et al. ................... 327/309
6,556,038 B2 * 4/2003 Kim et al. ..................... 326/30
6,762,614 B2 * 7/2004 Rearick et al. ............. 324/763
2002/0053923 A1 * 5/2002 Kim et al. ..................... 326/30
2002/0084817 A1 * 7/2002 Nair et al. .................. 327/175
2002/0118037 A1 * 8/2002 Kim et al. ..................... 326/30
2002/0135406 A1 * 9/2002 Hossain et al. ............. 327/112

OTHER PUBLICATIONS

Micron 288 Mb SIO Reduced Latency (RLDRAM II) Rev, 2, Pub Apr. 2003, Micron Technology, Inc. 2003 pp. 1-46, Boise, Idaho.

Micron TN-46-06, Technical Note Termination for Point-to-Point Systems, pp. 1-6-Rev. Jun. 2001, 2001 Micron Technology, Inc., Boise, Idaho.

* cited by examiner

*Primary Examiner*—Rexford Barnie
*Assistant Examiner*—Jason Crawford
(74) *Attorney, Agent, or Firm*—Duft, Bornsen & Fishman LLP

(57) ABSTRACT

Apparatus and methods are provided for improving data exchanges between electronic devices, such as memory controllers and RLDRAMs. An I/O cell includes a signal pad for transferring a first signal to an electronic device coupled thereto and for receiving a second signal from the electronic device. In one aspect, a duty cycle controller is coupled to the signal pad for balancing a duty cycle of the first signal with respect to a clock signal. In another aspect, dynamic switchable termination is coupled to the signal pad for providing termination impedance when the I/O cell is receiving the second signal.

15 Claims, 2 Drawing Sheets

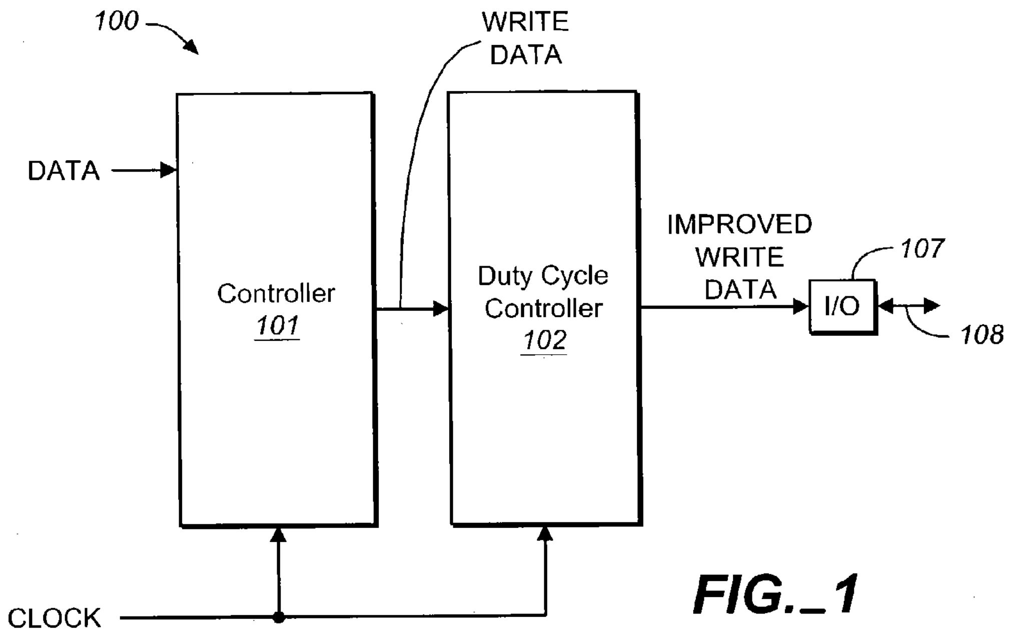
FIG._1
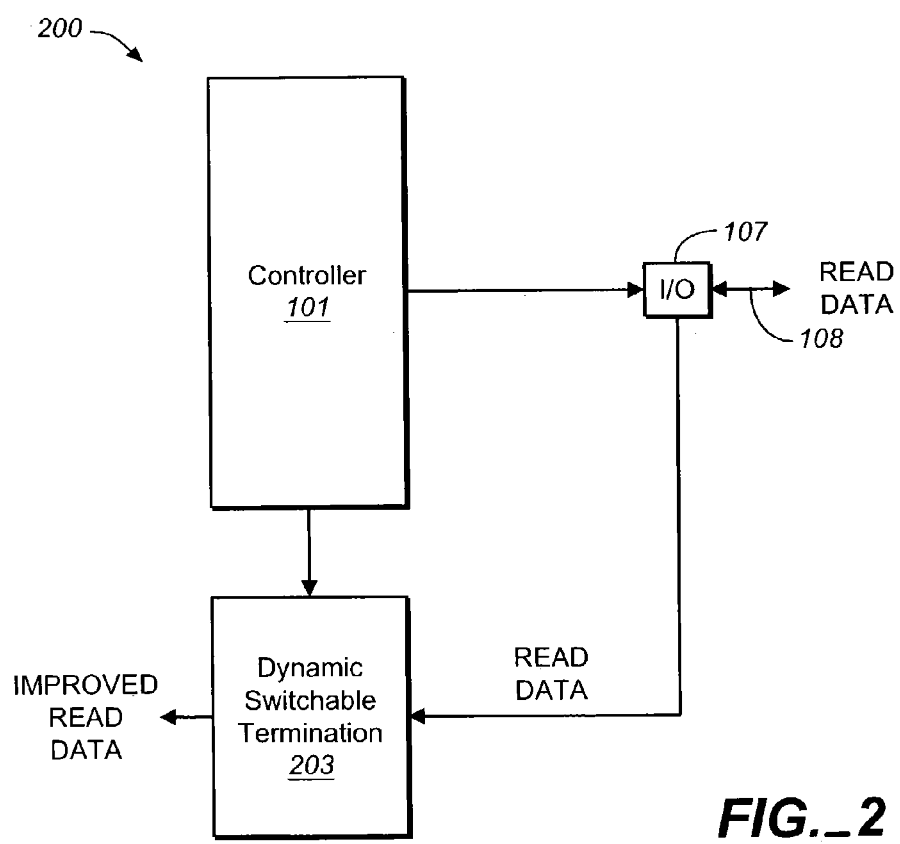
FIG._2

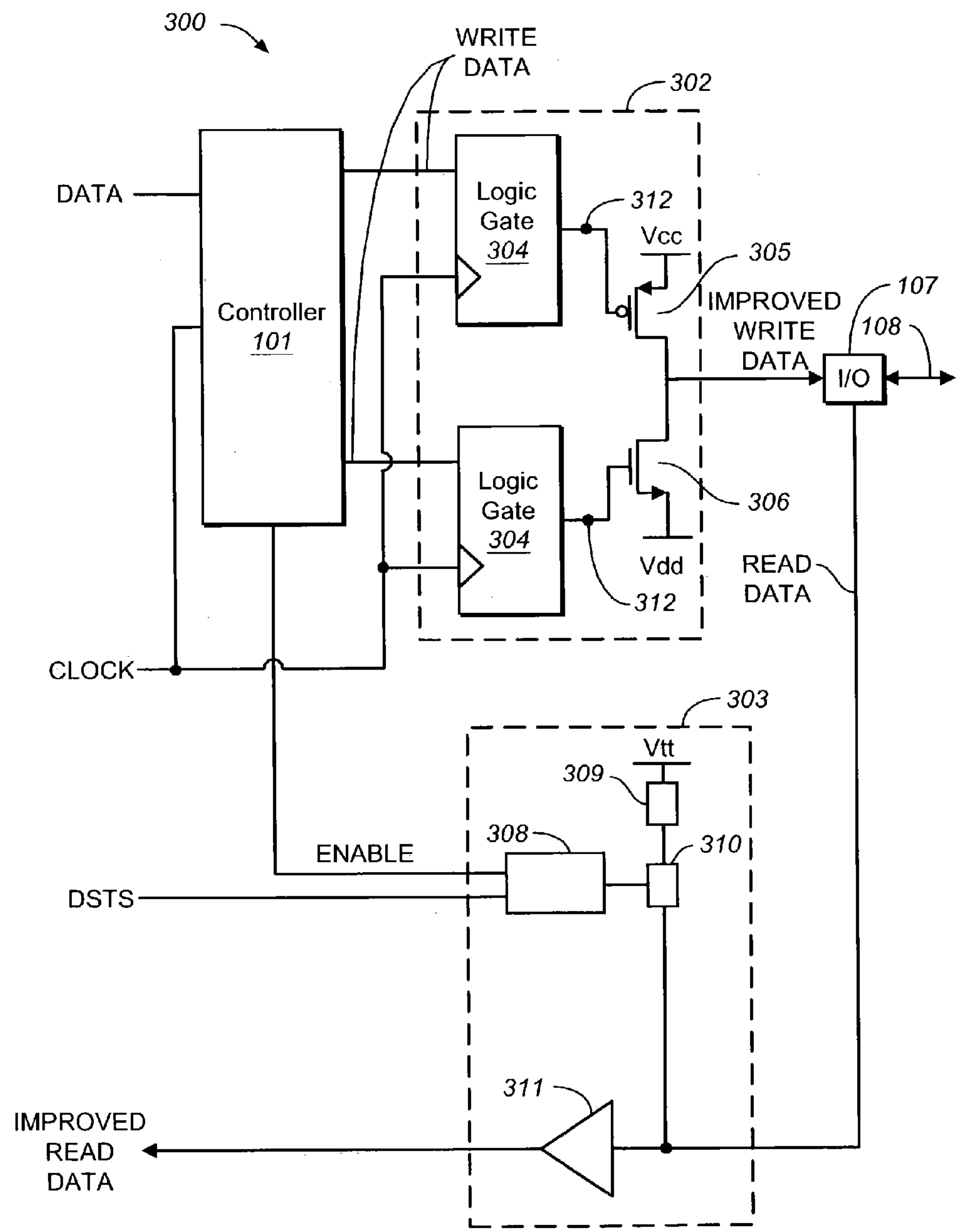
FIG._3

APPARATUS AND METHODS FOR IMPROVED INPUT/OUTPUT CELLS

BACKGROUND OF THE INVENTION

1. Field of the Invention

The invention generally relates to improvements in controlling data signals associated with input/output ("I/O") cells. More specifically, the invention relates to timing control of transmit data signals and dynamic termination of receive data signals associated with such I/O cells.

2. Discussion of Related Art

In present day electronic circuit design, it is common that a designer integrates a number of predefined components described by entries in a library of a computer aided design tool. Each such standard, predefined circuit is often referred to as a "cell" and the design process is often referred to as "standard cell design." As used herein, cell should be understood as synonymous with widely accepted terms such as "circuit" regardless of whether the features are designed as part of a standard cell design process or by other processes.

I/O cells are devices used to transmit and receive data between electronic devices. Such an I/O cell may exist as a component internal to an I/O device that is programmably configurable according to specifications of the I/O device. For example, a memory controller may be considered an I/O device that comprises an I/O cell for transmitting, or writing, data to a memory component and for receiving, or reading, data from the memory component in a manner consistent with the specifications of the I/O device. Examples of such memory components include a Reduced Latency Dynamic Random Access Memory ("RLDRAM"). Such I/O cells, however, are not exclusive to memory controllers, but can rather be used with, or in a litany of, other electronic devices exchanging data.

These I/O cells often control the data being transmitted and received in a variety of respects that include timing control and noise reduction. The need for strictly controlling data signals is exacerbated as data signaling speeds between electronic devices increase. Typically, digital circuit or cell designs are operated at frequencies defined by one or more periodic clock signals. High speed or higher data signaling speeds means circuits or cells that operate at higher clock signal frequencies as compared to slower cells. Higher data signaling speeds implies shorter durations between logic levels of the data signals. For example, as durations between logical levels of exchanged signals shorten, noise and/or signal irregularities with respect to the operating clock signals have a greater tendency to corrupt data because there exists a greater likelihood that these data corrupting problems will occur during transitions of the data signal or will cause inadvertent transitions in the data signal.

Signal irregularities can result from complexity of functional logic that generates a signal or can be the result of temperature variations and/or process variations in the functional logic of an I/O device. As used herein, functional logic refers to gates and/or other logic devices used in conjunction with generating and/or transmitting a data signal from an electronic device. Such variations in functional logic may also alter timing of a data signal being generated according to the clock signal. Subsequently, this altered data signal may corrupt data when the functional logic outputs the data signal to another device unaware of the altered timing. For example, duty cycle variations of the data signal with respect to the clock signal can be problematic because data transmitted from one circuit may be registered by a receiving circuit with respect to the rising edge and/or the falling edge of the clock signal common to both circuits. When timing of the data signal is altered, the rising and/or falling edges of the data signal are altered in time. Accordingly, a receiving device unaware of such timing alterations may attempt to register the data without regard to those timing alterations. This problem is exacerbated in RLDRAM devices that register signals according to both rising and falling edges of a clock signal (often referred to as Double Data Rate "DDR" devices, or "DDR"). Thus, if the variations in the data signal are not corrected, communicating devices may experience data corruption.

Noise, another data corrupting culprit, affects data by altering the shape of the signal. One predominate cause of noise, particularly in high speed electronics, is voltage reflection. Voltage reflection typically occurs when two or more interconnecting transmission and reception signal lines are improperly matched in terms of impedance. Thus, a transmitted signal may propagate through the transmission line to the interconnect and reflect all or part of the signal to create voltage disturbances for the presently transmitting data. Voltage reflections are more acute in high speed electronics because even sub-nanosecond voltage disturbances from such reflections can alter the high speed transitions of the data signal. As used herein, impedance refers to any impediment to transmission of a signal, such as resistance, capacitance and/or inductance.

As technology in the art of electronics has progressed, data speeds of electronic devices have increased and should continue to increase at drastic rates. Accordingly, the bounds of timing constraints for data exchanges are continually tested. Since voltage reflections and signal irregularities are problems that affect such high speed data exchanges, there exists a need for improved signal control in I/O cells to substantially reduce voltage reflections and signal duty cycle irregularities.

SUMMARY OF THE INVENTION

The present invention solves the above and other problems, thereby advancing the state of useful arts, by providing methods and associated structures for improving data exchanges between high speed electronics. More specifically, an I/O cell includes a bi-directional signal pad for transferring a first signal to an electronic device coupled thereto and for receiving a second signal from the electronic device. In one aspect hereof, a duty cycle controller is coupled to the signal pad for balancing a duty cycle of the first signal with respect to a clock signal for transmission out of the I/O cell. In another aspect, dynamic switchable termination is coupled to the signal pad for providing termination impedance when the I/O cell receives the second signal. Such termination impedance may match that of the electronics device coupled thereto so as to substantially reduce voltage reflections of the second signal caused by impedance mismatch.

In one exemplary embodiment of the invention, an I/O cell comprises: a bidirectional signal pad configured for transferring a first signal to a device coupled thereto and for receiving a second signal from the device; a duty cycle controller coupled to the signal pad and configured for balancing a duty cycle of the first signal with respect to a clock signal; and dynamic switchable termination ("DST") coupled to the signal pad and configured for providing termination impedance when the I/O cell is receiving the second data signal.

In another exemplary embodiment of the invention, the duty cycle controller comprises a logic circuit configured for gating the first signal using the clock signal.

In another exemplary embodiment of the invention, the I/O cell further comprises a controller configured for determining when the second signal is to be received from the signal pad and when the first signal is to be transferred to the signal pad.

In another exemplary embodiment of the invention, the dynamic switchable termination comprises a logic gate configured for receiving an enable signal from the controller when the second signal is to be received, wherein the logic gate enables the termination impedance based on the enable signal.

In another exemplary embodiment of the invention, the dynamic switchable termination comprises a process, voltage and temperature compensated resistor configured for providing the termination impedance.

In another exemplary embodiment of the invention, the duty cycle controller comprises a first flip-flop and a second flip-flop for gating the first signal with respect to the clock signal.

In another exemplary embodiment of the invention, the I/O cell further comprises an output stage coupled between the duty cycle controller and the bidirectional signal pad and configured for providing the first signal to the bidirectional signal pad, wherein the output stage comprises a first transistor having a gate coupled to the first flip-flop and a second transistor having a gate coupled to the second flip-flop.

In another exemplary embodiment of the invention, the first transistor and the second transistor are process, voltage and temperature compensated transistors.

In one exemplary embodiment of the invention, an I/O device comprises: an output signal pad configured for transferring a data signal to another device coupled thereto; an output driver comprising a first transistor and a second transistor for providing the data signal to the output signal pad; and a duty cycle controller comprising a first logic circuit coupled to a gate of the first transistor and a second logic circuit coupled to a gate of the second transistor, wherein the duty cycle controller is configured for balancing a duty cycle of the data signal with respect to a clock signal.

In another exemplary embodiment of the invention, the first logic circuit and the second logic circuit are adapted for gating the data signal to the output driver using the clock signal.

In another exemplary embodiment of the invention, the first logic circuit comprises a flip-flop.

In another exemplary embodiment of the invention, the I/O device further comprises a controller for determining when the data signal is to be transferred to the signal pad.

In another exemplary embodiment of the invention, the first and the second transistors are process, voltage and temperature compensated transistors.

In one exemplary embodiment of the invention, an I/O cell comprises: an input signal pad configured for receiving a signal from the device; and dynamic switchable termination coupled to the input signal pad and configured for providing termination impedance when the I/O cell is receiving the signal, wherein the termination impedance comprises process, voltage, and temperature compensated resistance.

In another exemplary embodiment of the invention, the I/O cell further comprises a controller for determining when the signal is to be received from the signal pad In another exemplary embodiment of the invention, the dynamic switchable termination comprises a logic gate configured for receiving an enable signal from the controller when the signal is to be received, wherein the logic gate enables the termination impedance based on the enable signal.

In one exemplary embodiment of the invention, a method for transceiving data comprises: transferring a first data signal to an externally coupled device comprising balancing a duty cycle of a first data signal of the data with respect to a clock signal; and receiving a second data signal of the data from the externally coupled device responsive to transferring and comprising dynamically applying termination impedance to the second data signal.

In another exemplary embodiment of the invention, balancing comprises gating the first data signal with a logic gate.

In another exemplary embodiment of the invention, the method further comprises: receiving the first data signal from the logic gate; and outputting the first data signal with a process, voltage and temperature compensated transistor.

In another exemplary embodiment of the invention, dynamically applying comprises receiving a control signal to dynamically apply a process, voltage and temperature compensated resistor.

BRIEF DESCRIPTION OF THE DRAWINGS

FIG. 1 is a block diagram of an I/O cell in an exemplary aspect of the invention.

FIG. 2 is block diagram of an I/O cell in another exemplary aspect of the invention.

FIG. 3 is a schematic diagram of an I/O cell in another exemplary aspect of the invention.

DETAILED DESCRIPTION OF THE DRAWINGS

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents and alternatives falling within the spirit and scope of the invention as defined by the appended claims.

With reference now to the figures and in particular with reference to FIG. 1, an aspect of the invention is shown in I/O cell 100. I/O cell 100 is configured for transferring a data signal (e.g., WRITE DATA) through bidirectional signal pad 107 to another device coupled at connection point 108. I/O cell 100 includes duty cycle controller 102 coupled to signal pad 107 for balancing the duty cycle of the data signal WRITE DATA with respect to the clock signal CLOCK. For example, duty cycle controller 102 may synchronize the transmission of the data signal WRITE DATA according to the clock signal CLOCK transitions. As such, the data signal WRITE DATA may be re-registered by duty-cycle controller 102 to substantially remove alterations imposed by functional logic, such as controller 101. Thus, duty cycle controller 102 may balance, or align, the data signal WRITE DATA with respect to the clock signal CLOCK and provide an improved data signal IMPROVED WRITE DATA.

Bidirectional signal pad 107 may be configured for transferring the improved data signal IMPROVED WRITE DATA to another device coupled at connection point 108. Signal pad 107 may also be configured to receive a data signal from another device when, for example, I/O cell 100 is not transferring data to the other device through the signal pad. Thus, signal pad 107 may function as an I/O pad for I/O cell 100.

I/O cell 100 may include controller 101 which may serve as functional logic, as described above, for the I/O cell. Controller 101 may be configured for determining when a read data signal (shown below) is to be received from signal pad 107 and when a write data signal (e.g., IMPROVED WRITE DATA) is to be transferred to signal pad 107. Such functional logic may be exclusive of other circuitry within an I/O device, such as that circuitry used for testing operability of the I/O device. Typically, functional logic unintentionally alters timing of the data signal WRITE DATA before the data signal reaches another device through signal pad 107. Accordingly, duty cycle controller 102 is interconnected between controller 101 and signal pad 107 to substantially minimize timing alterations of the data signal WRITE DATA associated with the functional logic of controller 101 and to provide improved data signal IMPROVED WRITE DATA.

Duty cycle controller 102 may comprise one or more flip-flops or other logic elements to register the data signal WRITE DATA out of controller 101 and provide improved data signal IMPROVED WRITE DATA to another device through signal pad 107. Duty cycle controller 102 receives the same or similar clock signal CLOCK that controller 101 receives. Therefore, once WRITE DATA is registered out of controller 101, duty cycle controller 102 again registers the WRITE DATA according to the clock signal CLOCK such that IMPROVED WRITE DATA is substantially unaffected by any duty cycle alterations associated with controller 101. In effect, WRITE DATA is re-registered in the "CLOCK domain" by controller 102 and applied as IMPROVED WRITE DATA to the signal pad 107.

I/O cell 100 may be configured with or in an I/O device, such as a memory controller configured to read from and/or write to a memory device. While FIG. 1 illustrates one exemplary I/O cell that substantially minimizes the effects of duty cycle alterations to a data signal, the invention is not intended to be limited to the features shown herein.

FIG. 2 shows another aspect hereof in I/O cell 200. I/O cell 200 is configured for dynamically providing termination impedance when the I/O cell is receiving a data signal READ DATA. For example, I/O cell 200 includes bidirectional signal pad 107 and controller 101, as described above, which may be configured for receiving data from another device coupled to connection point 108.

I/O cell 200 may include DST 203, coupled to signal pad 107. DST 203 may function as a switchable termination to provide termination impedance, as described above, when the I/O cell receives the data signal READ DATA. For example, controller 101 may enable DST203 when I/O cell 200 is ready to receive data from another device coupled at connection point 108. Once DST 203 is enabled by controller 101, the DST can dynamically apply switchable termination impedance such that the impedance between I/O cell 200 and the device coupled to connection point 108 are better matched. Such impedance matching may reduce voltage fluctuations in received data by substantially reducing voltage reflections of the inbound data signal READ DATA, as previously discussed. Accordingly, DST 203 may provide an improved data signal IMPROVED READ DATA.

While FIG. 2 illustrates one exemplary I/O cell that substantially minimizes voltage reflections by employing DST, the invention is not intended to be limited to the features shown herein. Rather, other implementations that apply such dynamic termination impedance to a received signal may also fall within the scope of the invention. FIG. 3 is a schematic diagram of I/O cell 300 in another aspect hereof I/O cell 300 combines circuitry for duty cycle control (e.g., circuitry 302) with circuitry for dynamic switchable impedance (e.g., circuitry 303). As such, circuitry 302 may operate according to duty cycle controller 102 of FIG. 1, and circuitry 303 may operate according to DST 203 of FIG. 2.

Controller 101, like controller 101 of FIGS. 1 and 2, is configured for determining when a read data signal (e.g., IMPROVED READ DATA) is to be received from signal pad 107 and when a write data signal (e.g., IMPROVED WRITE DATA) is to be transferred to the signal pad 107. When data is to be transferred through signal pad 107 to another device coupled to connection point 108, controller 101 gates, or registers, the data signal WRITE DATA using the clock signal CLOCK. Because of the above-mentioned timing control problems typically associated with controller 101, circuitry 302 may re-register the data signal WRITE DATA from controller 101. Such a re-registering by circuitry 302 may balance the duty cycle of the data signal with respect to the clock signal CLOCK to thereby generate the IMPROVED WRITE DATA signal. Circuitry 302 may then apply the improved data signal IMPROVED WRITE DATA for use by the other device connected at connection point 108.

Circuitry 302 may include logic gates 304 configured for registering the data signal WRITE DATA from controller 101 with the clock signal CLOCK, as described above. After registering the data signal WRITE DATA, logic gates 304 output the data signal to an output driver stage of circuitry 302 comprising driver transistors 305 and 306. For example, one of the logic gates 304 is connected to the gate of P-type Metal Oxide Semiconductor Field Effect Transistor ("MOSFET") 305 to drive the logic level high output of IMPROVED WRITE DATA. The other of logic gates 304 is connected to the gate of N-type MOSFET 306 to drive the logic level low output of IMPROVED WRITE DATA. Logic gates 304 may comprise flip-flops and/or other logic, known to those skilled in the art. Similarly, the output stage comprising MOSFETs 305 and 306 may be formed of other circuitry, such as process, voltage and temperature ("PVT") compensated transistors. For example, in a high speed embodiment, the best known mode would have transistors 305 and 306 formed as PVT compensated transistors. PVT compensated transistors are generally known to those skilled in the art. However, other lower speed embodiments may not require such PVT compensated transistors as timing issues may be less critical.

Circuitry 302 may also include test nodes 312 for testing functionality of the I/O cell 300. Signals applied to test nodes 312 may not rely on the duty cycle control aspects of circuitry 302 as such test functionality may not be susceptible to the duty cycle control problems associated with controller 101.

While circuitry 302 illustrates one feature hereof that may be used to balance the duty cycle of a data signal with respect to the clock signal CLOCK, those skilled in the art should appreciate that other equivalent implementations may operate similarly and may therefore fall within the scope of the invention. Accordingly, the invention is not intended to be limited to the number of logic gates and/or transistors of the depicted in FIG. 3.

Also shown in I/O cell 300 of FIG. 3 is circuitry 303. Circuitry 303 may include a logic gate 308, such as an AND gate, for enabling the termination impedance 309 of circuitry 303. For example, logic gate 308 may receive a DST signal DSTS from either the I/O device employing I/O cell 300 or controller 101 when termination impedance 309 is to be applied to the inbound data signal READ DATA. Accordingly, logic gate 308 enables the termination impedance 309 based on the signal DSTS by operating a switch 310 that applies the termination impedance to the data signal READ DATA at receiver buffer 311. Receiver buffer 311 may be any circuitry that receives the data signal READ DATA when such termination impedance is engaged by circuitry 303. Receiver buffer 311 may subsequently provide the improved data signal IMPROVED READ DATA to other circuitry, such as controller 101, within I/O cell 300 for processing of the signal. The improved data signal IMPROVED READ DATA may be equivalent to inbound READ DATA signal but with termination impedance applied.

Optionally, logic gate 308 may enable termination impedance 309 in conjunction with an enable signal ENABLE from controller 101. For example, when controller 101 determines that I/O cell 300 is to receive data from another device through signal pad 107, controller 101 may apply the enable signal ENABLE to logic gate 308 to alert circuitry 303 of such a determination. The logical combination of the signal ENABLE and the signal DSTS may induce logic gate 308 to apply a control signal to the switch 310 that correspondingly provides termination impedance 309 to the data signal READ DATA. Accordingly, termination impedance 309 may not be inadvertently applied by an assertion of the signal DSTS without an assertion of the enable signal ENABLE. In a preferred mode of the invention particularly useful in high speed applications, termination impedance 309 may represent a PVT compensated resistor, but any appropriate resistance or other impedance may be utilized in accord with the requirements of the particular application. PVT compensated resistors are generally known to those skilled in the art.

Circuitry 303 may be configured to apply termination impedance 309 between periods wherein the data signal READ DATA is received and the data signal IMPROVED WRITE DATA is transferred. For example, circuitry 303 may apply termination impedance 309 after the data signal IMPROVED WRITE DATA is transferred to another device through signal pad 107 and before the data signal READ DATA is received from the other device. These periods are the so-called "dead periods" in which there is no data exchanged between devices through signal pad 107. Such an implementation may be useful to ensure that termination impedance 309 is not applied during write cycles because another device receiving WRITE DATA through signal pad 107 may already employ a termination impedance which would, in turn, cause an impedance mismatch between the devices.

Upon receiving an indication that I/O cell 300 may transfer data to signal pad 107, circuitry 303 may disengage termination impedance 309 before the I/O cell begins transfer of the data signal IMPROVED WRITE DATA. For example, during the so-called dead periods, circuitry 303 may disengage termination logic 309 before I/O cell 300 can begin transfer of data signal IMPROVED WRITE DATA. Similarly, circuitry 303 may apply termination impedance 309 before I/O cell 300 can begin to receive data signal READ DATA.

While circuitry 303 illustrates one aspect hereof that may be used to apply termination impedance to an inbound data signal, such as READ DATA, those skilled in the art should appreciate that other equivalent implementations may operate similarly and may therefore fall within the scope of the invention. Accordingly, the invention is not intended to be limited to the number of logic gates, buffers and/or transistors depicted herein.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An I/O cell, comprising:
- a bidirectional signal pad configured for transferring a first signal to a device coupled thereto and for receiving a second signal from the device;
- a duty cycle controller coupled to the signal pad and configured for balancing a duty cycle of the first signal with respect to a clock signal; and
- a dynamic switchable termination coupled to the signal pad and configured for providing a termination impedance when the I/O cell is receiving the second data signal.

2. The I/O cell of claim 1, wherein the duty cycle controller comprises a logic circuit configured for gating the first signal using the clock signal.

3. The I/O cell of claim 1, further comprising a controller configured for determining when the second signal is to be received from the signal pad and when the first signal is to be transferred to the signal pad.

4. The I/O cell of claim 3, wherein the dynamic switchable termination comprises a logic gate configured for receiving an enable signal from the controller when the second signal is to be received, wherein the logic gate enables the termination impedance based on the enable signal.

5. The I/O cell of claim 1, wherein the dynamic switchable termination comprises a process, voltage and temperature compensated resistor configured for providing the termination impedance.

6. The I/O cell of claim 1, wherein the duty cycle controller comprises a first flip-flop and a second flip-flop for gating the first signal with respect to the clock signal.

7. The I/O cell of claim 6, further comprising an output stage coupled between the duty cycle controller and the bidirectional signal pad and configured for providing the first signal to the bidirectional signal pad, wherein the output stage comprises a first transistor having a gate coupled to the first flip-flop and a second transistor having a gate coupled to the second flip-flop.

8. The I/O cell of claim 7, wherein the first transistor and the second transistor are process, voltage and temperature compensated transistors.

9. An I/O device, comprising:
- an output signal pad configured for transferring a data signal to another device coupled thereto;
- an output driver comprising a first transistor and a second transistor for providing the data signal to the output signal pad; and
- a duty cycle controller comprising a first logic circuit coupled to a gate of the first transistor and a second logic circuit coupled to a gate of the second transistor, wherein the duty cycle controller is configured for balancing a duty cycle of the data signal with respect to a clock signal, and wherein the first logic circuit and the second logic circuit are adapted for gating the data signal to the output driver using the clock signal and the first logic circuit comprises a flip-flop.

10. The I/O device of claim 9, further comprising a controller for determining when the data signal is to be transferred to the signal pad.

11. The I/O device of claim 9, wherein the first and the second transistors are process, voltage and temperature compensated transistors.

12. A method for transceiving data, comprising:

transferring a first data signal to an externally coupled device comprising balancing a duty cycle of a first data signal of the data with respect to a clock signal; and receiving a second data signal of the data from the externally coupled device responsive to transferring and comprising dynamically applying a termination impedance to the second data signal.

13. The method of claim 12, wherein balancing comprises gating the first data signal with a logic gate.

14. The method of claim 13 further comprising:

receiving the first data signal from the logic gate; and outputting the first data signal with a process, voltage and temperature compensated transistor.

15. The method of claim 12, wherein dynamically applying comprises receiving a control signal to dynamically apply a process, voltage and temperature compensated resistor.

* * * * *